(12) United States Patent
Zhang

(10) Patent No.: US 11,398,554 B2
(45) Date of Patent: *Jul. 26, 2022

(54) SILICON ON INSULATOR DEVICE WITH PARTIALLY RECESSED GATE

(71) Applicant: STMICROELECTRONICS, INC., Coppell, TX (US)

(72) Inventor: John H. Zhang, Altamont, NY (US)

(73) Assignee: STMICROELECTRONICS, INC., Coppell, TX (US)

( * ) Notice: Subject to any disclaimer, the term of this patent is extended or adjusted under 35 U.S.C. 154(b) by 250 days.

This patent is subject to a terminal disclaimer.

(21) Appl. No.: 15/874,591

(22) Filed: Jan. 18, 2018

(65) Prior Publication Data

US 2018/0145135 A1 May 24, 2018

Related U.S. Application Data

(63) Continuation of application No. 14/175,308, filed on Feb. 7, 2014, now Pat. No. 9,905,648.

(51) Int. Cl.
| | |
|---|---|
| H01L 29/10 | (2006.01) |
| H01L 29/66 | (2006.01) |
| H01L 21/8238 | (2006.01) |
| H01L 29/786 | (2006.01) |
| H01L 29/78 | (2006.01) |
| H01L 29/165 | (2006.01) |

(52) U.S. Cl.
CPC .. *H01L 29/1054* (2013.01); *H01L 21/823807* (2013.01); *H01L 21/823828* (2013.01); *H01L 29/66545* (2013.01); *H01L 29/66583* (2013.01); *H01L 29/66621* (2013.01); *H01L 29/66651* (2013.01); *H01L 29/66772* (2013.01); *H01L 29/78684* (2013.01); *H01L 29/78696* (2013.01); *H01L 29/165* (2013.01); *H01L 29/66636* (2013.01); *H01L 29/7848* (2013.01)

(58) Field of Classification Search
CPC ......... H01L 21/823828; H01L 29/1054; H01L 29/78684; H01L 29/78696
USPC ....................................................... 257/347
See application file for complete search history.

(56) References Cited

U.S. PATENT DOCUMENTS

| | | |
|---|---|---|
| 6,495,890 B1 | 12/2002 | Ono |
| 6,630,385 B1 | 10/2003 | Yu |

(Continued)

*Primary Examiner* — Nduka E Ojeh
(74) *Attorney, Agent, or Firm* — Seed IP Law Group LLP

(57) ABSTRACT

Transistors having partially recessed gates are constructed on silicon-on-insulator (SOI) semiconductor wafers provided with a buried oxide layer (BOX), for example, FD-SOI and UTBB devices. An epitaxially grown channel region relaxes constraints on the design of doped source and drain profiles. Formation of a partially recessed gate and raised epitaxial source and drain regions allow further improvements in transistor performance and reduction of short channel effects such as drain induced barrier lowering (DIBL) and control of a characteristic subthreshold slope. Gate recess can be varied to place the channel at different depths relative to the dopant profile, assisted by advanced process control. The partially recessed gate has an associated high-k gate dielectric that is initially formed in contact with three sides of the gate. Subsequent removal of the high-k sidewalls and substitution of a lower-k silicon nitride encapsulant lowers capacitance between the gate and the source and drain regions.

20 Claims, 8 Drawing Sheets

(56) References Cited

U.S. PATENT DOCUMENTS

| | | |
|---|---|---|
| 6,710,383 B2 | 3/2004 | Yugami et al. |
| 2002/0163036 A1 | 11/2002 | Miura et al. |
| 2005/0095852 A1 | 5/2005 | Saenger et al. |
| 2005/0167763 A1 | 8/2005 | Kuan et al. |
| 2006/0022239 A1* | 2/2006 | Mouli ................ H01L 21/8213 257/296 |
| 2007/0040223 A1* | 2/2007 | Datta ................ H01L 21/28114 257/E21.205 |
| 2008/0026516 A1 | 1/2008 | Chakravarti et al. |
| 2008/0087916 A1* | 4/2008 | Amasuga ............ H01L 29/0649 257/194 |
| 2008/0121931 A1* | 5/2008 | Chen ................ H01L 29/66628 257/192 |
| 2009/0061586 A1* | 3/2009 | Yu .................... H01L 29/66636 438/296 |
| 2009/0085115 A1 | 4/2009 | Atanackovic |
| 2011/0241085 A1 | 10/2011 | O'Meara et al. |
| 2012/0037991 A1 | 2/2012 | Guo et al. |
| 2012/0261754 A1* | 10/2012 | Cheng ............... H01L 29/66772 257/347 |
| 2012/0313144 A1 | 12/2012 | Zhang et al. |
| 2013/0299916 A1 | 11/2013 | Won et al. |
| 2014/0027854 A1 | 1/2014 | Asenov |
| 2017/0186845 A1* | 6/2017 | Abou-Khalil ....... H01L 29/0649 |

* cited by examiner

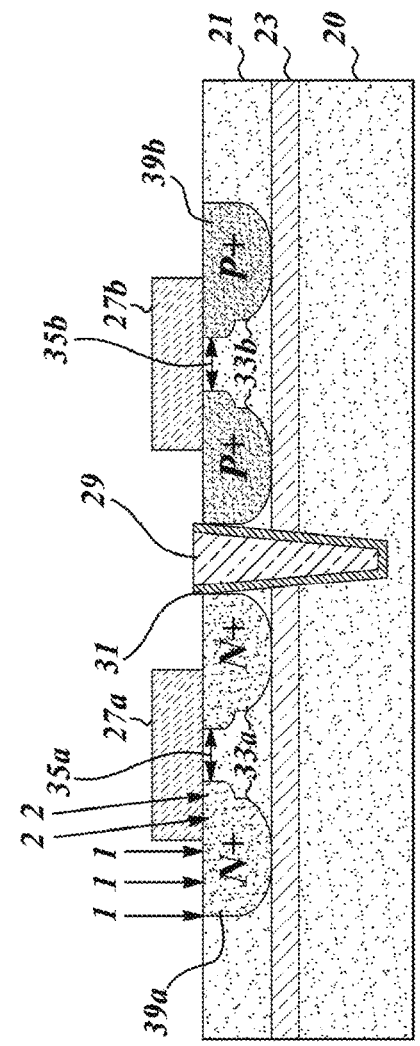
*Fig.2B*
*Fig.2C*
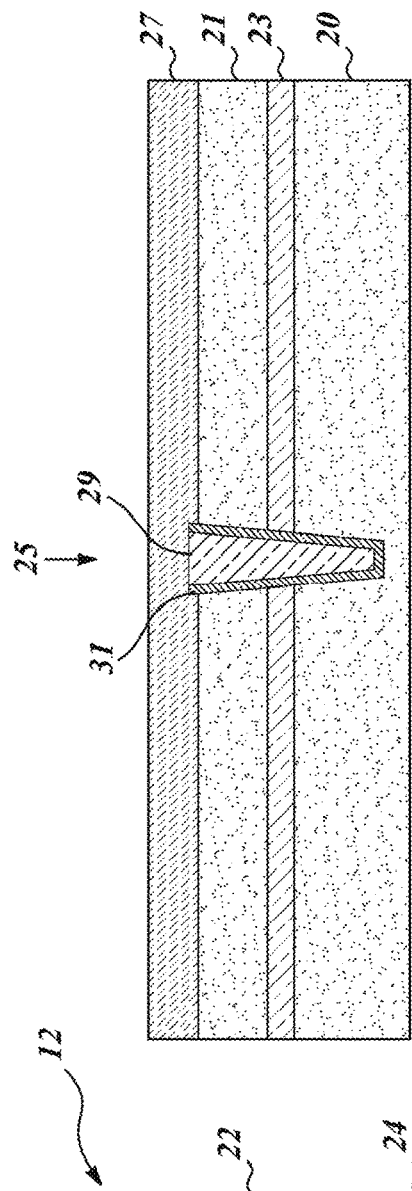
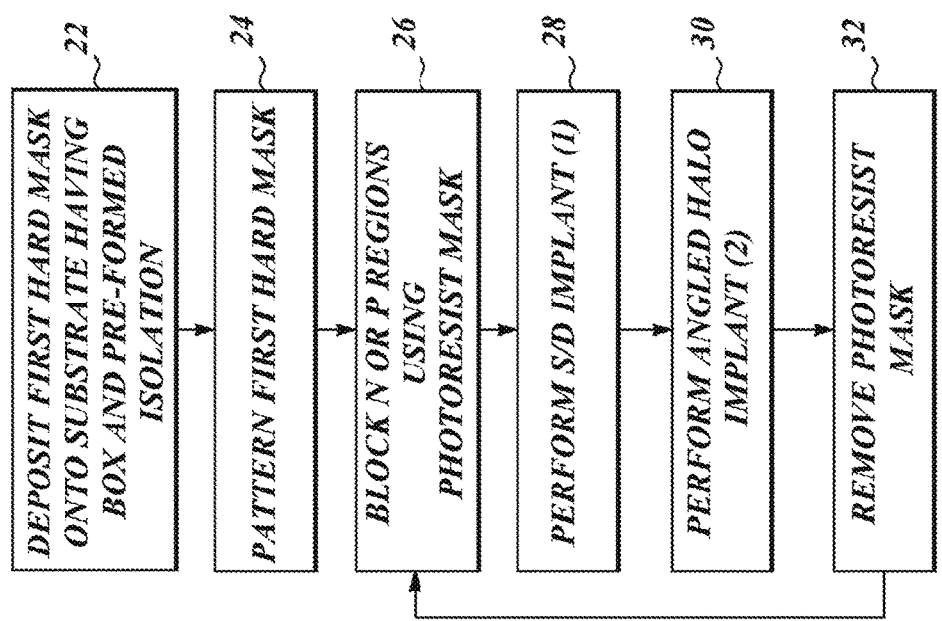
*Fig.2A*

SILICON ON INSULATOR DEVICE WITH PARTIALLY RECESSED GATE

BACKGROUND

Technical Field

The present disclosure relates to the fabrication of nanometer-sized integrated circuit planar field-effect transistor (FET) devices.

Description of the Related Art

As technology nodes for integrated circuits scale below 10 nm, maintaining precise control of various electrical characteristics in semiconductor devices becomes increasingly more challenging. Such semiconductor devices include, for example, metal-oxide-semiconductor field-effect transistors (MOSFETs). A MOSFET is a three-terminal switching device that includes a source, a gate, and a drain. MOSFETs are interconnected by a network of wires through contacts to each of the source, drain, and gate terminals.

When a voltage exceeding a selected threshold voltage ($V_t$) is applied to the MOSFET gate, the device switches on so that an electric current flows through a channel between the source and the drain. The value of $V_t$ depends, in part, on the characteristic energy band structure of the semiconductor material. The source and drain regions are typically doped with ions that serve as charge reservoirs for the device. Device performance parameters such as switching speed and on-resistance are largely dependent upon control of doping concentrations and depth profiles of the dopants in the substrate following implantation and annealing of the implanted regions at high temperatures.

For many years, device designers strived to fashion the tips of dopant profiles so as to reduce the channel length, thereby increasing the switching speed of the device. However, when the channel length between the doped source and drain regions is reduced so far as to be comparable to their depth, current may leak through such a short channel, causing the device to turn on at an applied voltage that is less than the threshold voltage. Off-state leakage is thus an example of a short channel effect (SCE). Present technology challenges include preventing off-state leakage and other short channel effects such as drain-induced barrier lowering (DIBL), and controlling a device characteristic referred to as a sub-threshold slope (SS). DIBL occurs when a high drain voltage causes the transistor to turn on prematurely, even though the $V_t$ electric potential barrier has not been overcome. DIBL occurs because in a short channel device, the drain voltage has a greater influence over device performance, due to its closer proximity to the center of the channel. A device having a steep SS transitions faster from an off state to an on state. Thus, controlling the SS can be another important factor in improving device performance.

Strained silicon transistors address some of these challenges by replacing bulk silicon in the source and drain regions, or in the channel region, with epitaxially grown silicon compounds such as, for example, epitaxially grown silicon germanium (SiGe). Introducing strain into the silicon crystal of a MOSFET tends to increase charge mobility in the channel region, thereby improving performance without the need for a short channel. However, strained silicon and other new technologies fail to address all of the technology challenges listed above.

Another FET technology that addresses short channel effects entails use of a recessed gate, as described in U.S. Patent Application Publication US2012/0313144, by the same inventor as in the present patent application. Other examples of recessed gate architectures are found in U.S. Pat. No. 6,630,385 to Bin Yu. A recessed gate device features a metal gate buried between the source and drain regions, and a current channel below the recessed gate, near the lower boundaries of the source and drain regions where they meet the buried oxide layer (BOX). Whereas in a conventional FET, the channel length is governed by implant profiles of the source and the drain regions, in a recessed gate device, the channel length is set by the width of the gate, which is easier to control. The channel length in a recessed gate device is further tuned by adjusting the width of sidewall spacers on either side of the gate. Thus, short channel effects can be avoided by fabricating a channel having a selected minimum length. When the channel is bounded above by the recessed gate and below by a buried oxide layer, the gate maintains tighter control over the charge flowing therein.

BRIEF SUMMARY

Transistors having partially recessed gates are constructed on a silicon-on-insulator (SOI) semiconductor wafer provided with a buried oxide layer (BOX), for example, an ultra-thin body and buried oxide (UTBB) wafer. The BOX helps to shape source and drain dopant profiles of a MOSFET, to assist in controlling transistor performance. An epitaxially grown channel further relaxes constraints on the design of doped source and drain profiles. Formation of a partially recessed gate and raised source and drain regions allow further improvements in transistor performance and reduction of short channel effects such as drain-induced barrier lowering (DIBL) and sub-threshold slope (SS). The depth of gate recess can be varied to place the channel at different depths relative to the dopant profile. Furthermore, advanced process control can be used to guide formation of the recessed gate in accordance with the dopant profiles.

The partially recessed gate has an associated high-k gate dielectric that is initially formed in contact with three sides of the gate. Subsequent removal of high-k sidewalls from the gate structure, and substitution of a lower-k silicon nitride encapsulant, lowers capacitance between the gate and the source and drain regions. The resulting structure may be thought of as a gate dielectric that has a first material in a central region, such as a hafnium oxide, and a second material in peripheral regions, such as a silicon nitride or a silicon dioxide. The transistor may be a partially-depleted or a fully-depleted silicon-on-insulator (FD-SOI) device.

BRIEF DESCRIPTION OF THE SEVERAL VIEWS OF THE DRAWINGS

In the drawings, identical reference numbers identify similar elements. The sizes and relative positions of elements in the drawings are not necessarily drawn to scale.

FIG. 2A is a process flow diagram showing a detailed sequence of processing steps that can be used to form N-doped and P-doped carrier reservoirs in the source and drain regions of the NFET and PFET devices according to one embodiment that employs ion implantation.

FIGS. 2B and 2C are cross-sectional views of PFET and NFET devices after carrying out processing steps shown in FIG. 2A.

FIG. 5A is a process flow diagram showing a detailed sequence of processing steps that can be used to form an insulator over the NFET and PFET devices, according to one embodiment.

DETAILED DESCRIPTION

Figure 1:
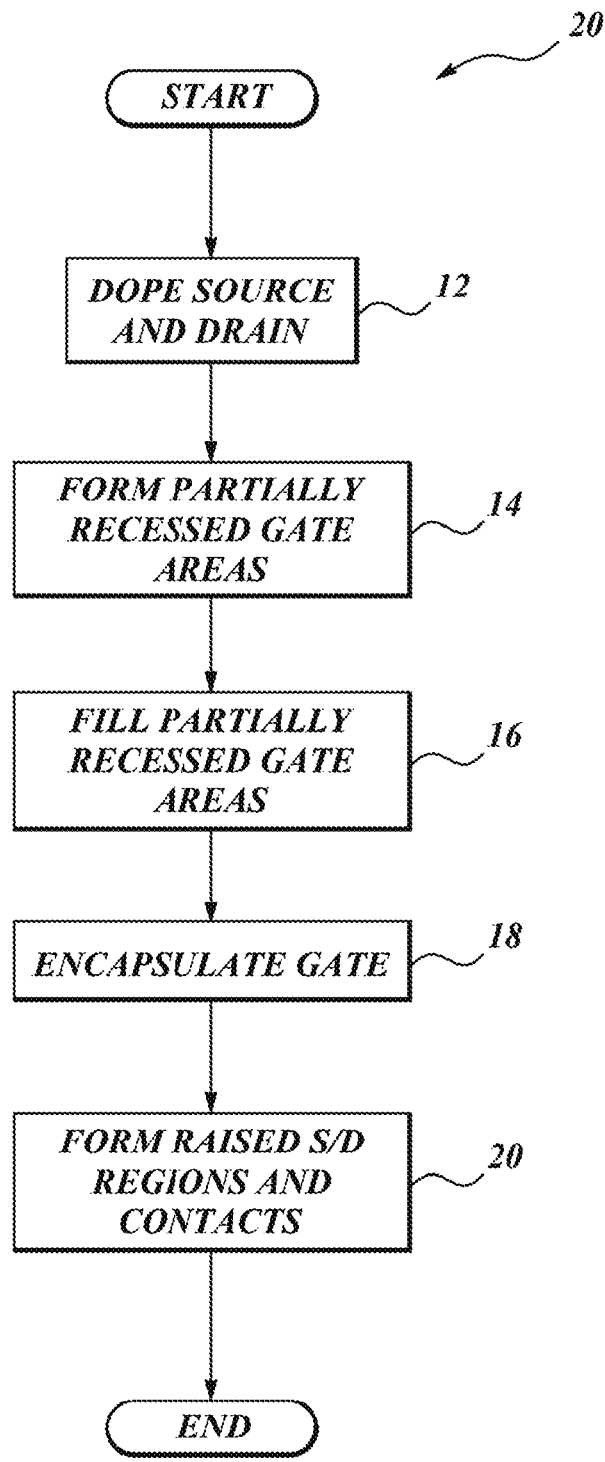
FIG. 1 is a high-level flow diagram summarizing a processing sequence for fabricating MOSFET devices having a partially recessed gate according to one exemplary embodiment described herein.

In the following description, certain specific details are set forth in order to provide a thorough understanding of various aspects of the disclosed subject matter. However, the disclosed subject matter may be practiced without these specific details. In some instances, well-known structures and methods of semiconductor processing comprising embodiments of the subject matter disclosed herein have not been described in detail to avoid obscuring the descriptions of other aspects of the present disclosure.

Unless the context requires otherwise, throughout the specification and claims that follow, the word "comprise" and variations thereof, such as "comprises" and "comprising" are to be construed in an open, inclusive sense, that is, as "including, but not limited to."

Reference throughout the specification to "one embodiment" or "an embodiment" means that a particular feature, structure, or characteristic described in connection with the embodiment is included in at least one embodiment. Thus, the appearance of the phrases "in one embodiment" or "in an embodiment" in various places throughout the specification are not necessarily all referring to the same aspect. Furthermore, the particular features, structures, or characteristics may be combined in any suitable manner in one or more aspects of the present disclosure.

Reference throughout the specification to integrated circuits is generally intended to include integrated circuit components built on semiconducting substrates, whether or not the components are coupled together into a circuit or able to be interconnected. Throughout the specification, the term "layer" is used in its broadest sense to include a thin film, a cap, or the like. The term "layout" refers to a drawn pattern seen from a top plan view that implements an integrated circuit design. The layout specifies geometries and spacings of materials formed at each layer of the integrated circuit. Geometries and spacings for each layout are calculated according to a desired operational circuit specification.

Reference throughout the specification to conventional thin film deposition techniques for depositing silicon nitride, silicon dioxide, metals, or similar materials include such processes as chemical vapor deposition (CVD), low-pressure chemical vapor deposition (LPCVD), metal organic chemical vapor deposition (MOCVD), plasma-enhanced chemical vapor deposition (PECVD), plasma vapor deposition (PVD), atomic layer deposition (ALD), molecular beam epitaxy (MBE), electroplating, electro-less plating, and the like. Specific embodiments are described herein with reference to examples of such processes. However, the present disclosure and the reference to certain deposition techniques should not be limited to those described. For example, in some circumstances, a description that references CVD may alternatively be done using PVD, or a description that specifies electroplating may alternatively be accomplished using electroless plating. Furthermore, reference to conventional techniques of thin film formation may include growing a film in situ. For example, in some embodiments, controlled growth of an oxide to a desired thickness can be achieved by exposing a silicon surface to oxygen gas or to moisture in a heated chamber. The term "epitaxy" refers to a controlled process of crystal growth in which a new layer of a crystal is grown from the surface of a bulk crystal, while maintaining the same crystal structure as the underlying bulk crystal. The new layer is then referred to as an "epitaxially grown" or "epitaxial" layer. Impurities can be incorporated into an epitaxial film, in situ, as the crystal structure is formed, without imparting damage to the crystal structure.

Reference throughout the specification to conventional photolithography techniques, known in the art of semiconductor fabrication for patterning various thin films, includes a spin-expose-develop process sequence typically followed by an etch process. Alternatively or additionally, photoresist can also be used to pattern a hard mask, which, in turn, can be used to pattern an underlying film.

Reference throughout the specification to conventional etching techniques known in the art of semiconductor fabrication for selective removal of polysilicon, silicon nitride, silicon dioxide, metals, photoresist, polyimide, or similar materials includes such processes as wet chemical etching, reactive ion (plasma) etching (RIE), washing, wet cleaning, pre-cleaning, spray cleaning, chemical-mechanical planarization (CMP) and the like. Specific embodiments are described herein with reference to examples of such processes. However, the present disclosure and the reference to certain deposition techniques should not be limited to those described. In some instances, two such techniques may be interchangeable. For example, stripping photoresist may entail immersing a sample in a wet chemical bath or, alternatively, spraying wet chemicals directly onto the sample.

Specific embodiments are described herein with reference to examples of transistor devices and transistor layouts that have been produced; however, the present disclosure and the reference to certain materials, dimensions, and the details and ordering of processing steps are exemplary and should not be limited to those shown.

In the figures, identical reference numbers identify similar features or elements. The sizes and relative positions of the features in the figures are not necessarily drawn to scale. Throughout the specification, wherever reference numerals Xa and Xb are used, they describe a common structure X within the NFET and PFET devices, respectively. Hence, reference numeral 51 denotes a transistor gate, 51*a* denotes the gate of an NFET device, and 51*b* denotes the gate of a PFET device.

FIG. 1 shows a high-level sequence of processing steps in a method 10 that can be used to create FET devices having partially recessed gates, according to a first embodiment. The exemplary devices described herein incorporate an epitaxially grown channel, with raised doped source and drain regions. With these features, the partially recessed gate FET device can comparable performance to a short channel device without experiencing the undesirable short channel effects, thus increasing reliability of the device.

At 12, the substrate is doped to create source and drain regions that act as charge reservoirs for the transistors.

At 14, openings for partially recessed gate areas are formed between, and extending into, the doped source and drain regions.

At 16, the partially recessed gate areas are filled by forming a planar epitaxial channel between the source and drain regions, and by depositing a gate stack that includes a gate dielectric in contact with the planar epitaxial channel, and a metal gate.

At 18, the gate is encapsulated on three sides with a silicon nitride layer that acts as a spacer.

At 20, the source and drain regions are raised, an insulating material is deposited, and contacts are made to the source, drain, and gate terminals.

FIG. 2A describes the process step 12 in further detail, as a sequence of steps 22-32 that can be used to dope source and drain regions of the NFET and PFET devices by ion implantation, as shown FIGS. 2B, and 2C, according to one embodiment. The sequence of processing steps begins with a silicon substrate 20 that includes a buried oxide layer (BOX) 23 and an active area 21. Such is a typical start material that is widely available for purchase as an SOI wafer for fabricating silicon-on-insulator (SOI) devices. In one embodiment, the type of SOI wafer is an ultra-thin body and buried oxide (UTBB) wafer, having a preferred thickness of about 25 nm, and the thickness of the active area is desirably about 7 nm.

The isolation region 25 is previously formed between the areas in which N- and P-type devices will be made, so as to delineate adjacent NFET and PFET devices both physically and electrically using well known steps. For example, an isolation trench is patterned so as to extend downward into the silicon substrate 20 using conventional lithography and reactive ion etching (RIE) techniques known to those skilled in the art of semiconductor fabrication. The isolation region 25 is then filled with an insulating material 29, typically a type of silicon dioxide (SiO$_2$). Sometimes the isolation region 25 is referred to as shallow trench isolation (STI), though the aspect ratio (depth:width) of the trenches may not be consistent with the term "shallow." For example, in the embodiment as described herein, the depth of the STI is within the range of about 10-200 nm. The STI fill operation can be carried out according to known plasma deposition techniques. Some STI regions electrically insulate the NFET and PFET devices from neighboring similar devices, while others, like the isolation region 25, insulate the NFET and PFET devices from one another. The isolation region 25 can include an isolation liner 31, made of, for example, a layer of silicon dioxide or silicon nitride. To accommodate a raised source and drain later in the process, the isolation region 25 can be formed so as to extend slightly above the surface of the active area 21.

At 22, a first hard mask layer 27 is blanket deposited onto the active area 21. The first hard mask layer 27 can be made of silicon nitride, having a thickness in the range of about 5-60 nm. Prior to depositing the hard mask layer 27, a pad oxide can be first formed on layer 21 as is known in the art.

At 24, the first hard mask layer 27 is patterned using conventional lithography so as to cover the active area 21 in the areas where the gate will be formed. Thus, the first hard mask serves as a sacrificial dummy gate, whereas conventional processes typically form the actual gate at this step in the fabrication process.

At 26, the PFET area to the right of the isolation region 25 is blocked with a photoresist mask while N-type dopants are implanted into the NFET area to the left of the isolation region 25 by conventional ion implantation.

At 28, a first source/drain implantation is carried out to introduce negative ions such as phosphorous or arsenic into the silicon active area 21, creating doped source and drain regions 39. The first source/drain implantation 1 occurs in a downward direction, substantially normal to the surface of the active area 21. The penetration depth of the negative ions during the first source/drain implantation is limited by the depth of the BOX layer 23, which is typically in the range of about 1-180 nm as supplied by the manufacturer of standard SOI or UTBB-type SOI wafers. The thickness of such a BOX layer 23 is itself within the range of about 1-100 nm.

At 30, a second implantation 2, known as a halo implant to those skilled in the art, is carried out by implanting positive ions in a slightly diagonal direction with respect to the surface of the active area 21. In one embodiment, the halo implantation is carried out at a tilt angle in the range of about 5-10 degrees with respect to normal to the surface of the active area 21 so that a halo of positive ions forms near the inner tip of the N+ region. Following the halo implant, annealing at a temperature exceeding 1000 degrees serves to form the desired doping profiles 33*a* and 33*b*, activate the dopant ions, and repair damage to the crystal structure of the surrounding substrate. The sequence of source/drain implantation and halo implantation can be switched, so that the halo implantation occurs first.

Following the annealing step, the doping profiles 33 at the surface of the active area 21 are separated by a short distance 35 which is known to affect, in a completed transistor, the undesirable short channel effects described above. In the embodiments described herein, the short distance 35 is modified as described below to alleviate such short channel effects.

The doping profiles 33 can be selected in anticipation of the final shape of the source/drain interface with the active region 21 that will form the channel. As is well known, source/drain implants often have a lightly doped drain (LDD) region. In addition, various implant depths and doses are used including combinations of phosphorous and arsenic depending on the desired doping profile and conduction properties. As explained later herein, the channel region (see 43*a* and 43*b* in FIGS. 6B-6D) will be placed at a certain depth, relative to the doping profiles 33, depending on the depth of the etch carried out at step 40 to a depth 41 as explained later herein. At the time the source/drain implants are made, the doping profile is selected to obtain a desired end doping profile based on the depth 41, as explained later herein.

At 32, the photoresist mask is removed.

The steps 26-32 are then repeated to carry out the P-source and drain implants, during which the N-type area to the left of the isolation region is masked. The first and second P-type source/drain implants can be carried out using, for example, boron ions.

In another embodiment, the source and drain regions having the doping profiles 33 can be formed by an epitaxial method instead of by ion implantation, as is known in the art. Such a method entails etching the silicon active region 21 using an isotropic etch that is selective to the first hard mask 27, and then filling the etched regions with an epitaxially grown doped film. In this method, dopants are introduced in-situ during the process of epitaxial growth. As a result, mechanical damage to the crystal structure, that would otherwise occur with ion implantation, is avoided. Hence, an annealing step is not needed following epitaxial formation of the doped source and drain regions.

Materials used to form epitaxial N-type source and drain regions can include, for example, silicon carbide (SiC) doped in-situ with arsenic (As) or phosphorous (P), in which the carbon concentration is in the range of about 0.25-1%. Materials used to form epitaxial P-type source and drain regions can include, for example, silicon germanium (SiGe) doped in-situ with boron (B). An advantage of the epitaxial method of forming the source and drain regions is that the doped SiC source and drain in the N-type device relaxes the crystalline structure causing tensile stress in the channel region 53, thereby increasing electron mobility during operation of the NFET. Similarly, the doped SiGe source and drain in the P-type device causes compressive strain in the channel region 53, thereby increasing hole mobility during operation of the PFET.

Figure 3B:
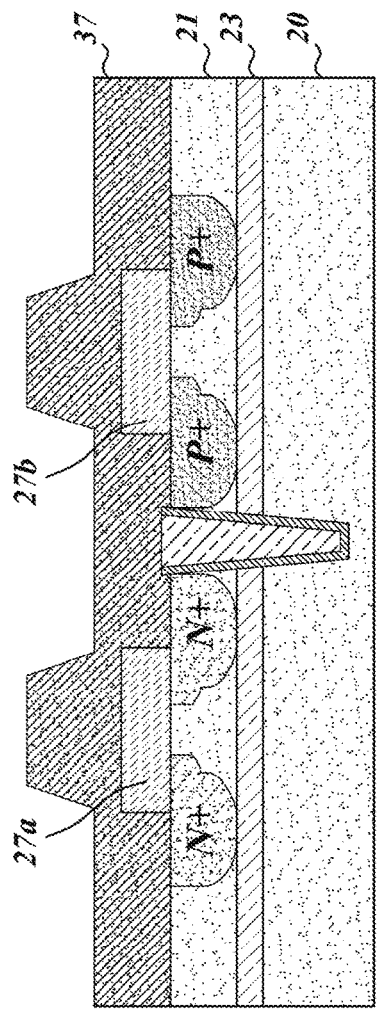
FIGS. 3B-3D are cross-sectional views of the NFET and PFET devices after carrying out processing steps shown in FIG. 3A.
Figure 3C:
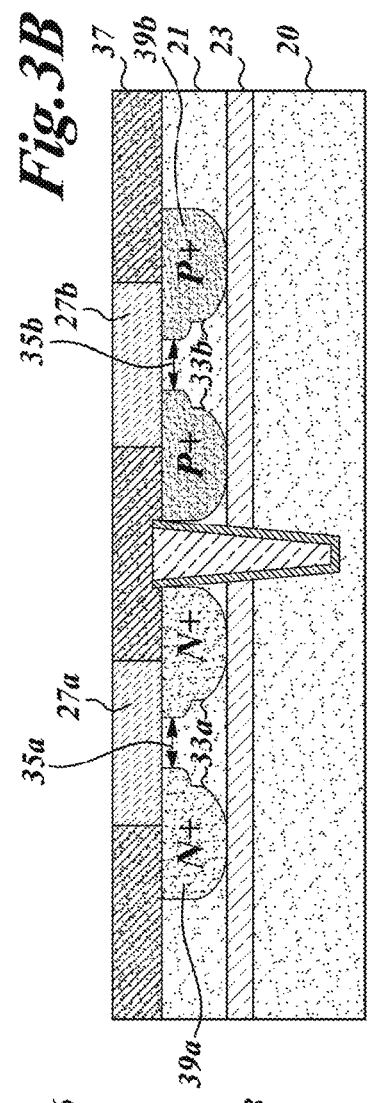
Figure 3D:
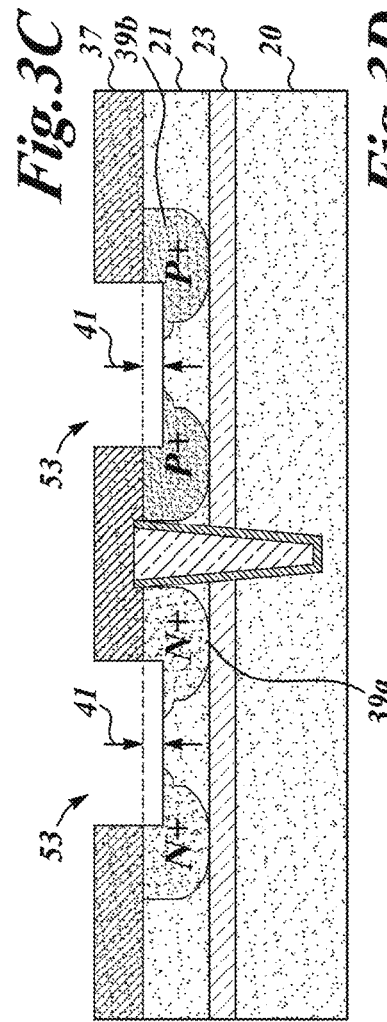
Figure 3A:
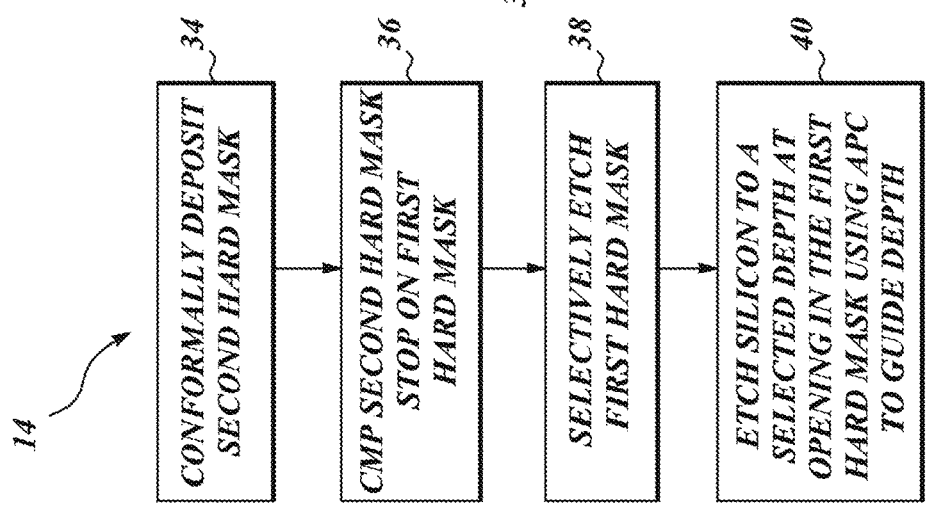
FIG. 3A is a process flow diagram showing a detailed sequence of processing steps that can be used to form partially recessed gate regions of the NFET and PFET devices, according to one embodiment.

FIG. 3A describes the process step 14 in further detail, as a sequence of steps 34-40 that can be used to form partially recessed gate areas, as shown FIGS. 3B-3D, according to one embodiment.

At 34, a second hard mask 37 is conformally deposited over the first hard mask layer 27 to occupy spaces between the dummy gate structures. The second hard mask layer 37 can be made of silicon dioxide or polysilicon, for example, or any insulating material that can sustain subsequent removal of the first hard mask layer 27 by a reactive ion etch process.

At 36, the second hard mask 37 is planarized by a conventional chemical-mechanical planarization (CMP) step, stopping on the first hard mask layer 27.

At 38, the first hard mask 27 is removed by selectively etching the silicon nitride without removing the second hard mask 37, which is an oxide. Such a selective gate etch can be accomplished using an RIE process that is carried out in a plasma etcher.

At 40, the recessed gate etch process is carried out by etching below the surface of the active area 21 so as to create partially recessed gate areas 53 that extend into the doped source and drain regions 39. The partially recessed gate areas 53 will accommodate a gate stack that includes the epitaxial channel, gate dielectric, and metal gate formed in subsequent processing steps. By etching the second hard mask 37 to form an opening for the partially recessed gate areas 53 for sequential deposition of the gate stack components, such component films making up the gate stack will automatically be self-aligned and centered relative to the source and drain regions 39.

The depth of the etch process to create the recessed gate can be targeted using an advanced process control (APC) scheme in which, for example, dopant profile data collected during the ion implantation processing steps 28 and 30 is forwarded to a controller that controls the reactive ion etch (RIE) equipment. The etch chemistry will be one selected for uniform etching of silicon, such etches being well known in the art. In an alternative embodiment in which epitaxial deposition is used to form the source and drain regions instead of ion implantation, the dopant profiles 33a and 33b can be obtained using metrology equipment to measure the depth of the etch profiles prior to epitaxial growth. Using APC, a customized target depth can be set for the etching process on a lot-by-lot basis, wherein the target depth is based on the ion implantation data. In this way, etch profiles of the partially recessed gate areas 53 can be adjusted to match the doping profiles 33. Such adjustments can be made to a timed etch process to guide formation of the recess depth so that the recess desirably extends below the surface of the silicon, but not below the lower boundary of the halo implant. In one example, a recess depth 41 is desirably in the range of about 5-10 nm in some embodiments.

Alternatively, the gate etch process can be endpointed in-situ so as to stop when a release of material from the N-type and P-type source and drain regions is detected during the etch process. If needed, an over-etch can then be executed following the endpoint detection to achieve the desired recess depth 41.

Formation of the partially recessed gate areas 53, shown in FIG. 3D, serves to reduce short channel effects by lowering the gate structure into the region between the halo implants. The implant profiles are thus selected so that it is less likely that charge will leak between the tips of the source and drain regions 39 causing a short circuit. By adjusting the recess depth 41, the halo implant profile is further optimized by controlling and adjusting the recess etch in addition to adjusting implant step directly.

It is noted that the process sequence described above for formation of partially recessed gate MOSFET transistors is executed in the opposite order from a conventional MOSFET fabrication process. In a conventional MOSFET fabrication process, a gate is formed first, above the surface of the substrate, for use as a mask during implantation of the source and drain regions, whereas, according to the present scheme, the source and drain regions are formed first, and the source and drain profiles can then be used to guide formation of a recessed gate structure. Such a process sequence was described in U.S. Patent Application Publication 2012/0313144 to Zhang et al., entitled "Recessed Gate Field Effect Transistor," published on Dec. 13, 2012.

The recess depth 41 can also be used to tune various electrical characteristics of the transistors. In one example, using an additional set of masks, the gate etch can be tuned separately for the PFET and NFET devices if different recess depths 41 are desired for the different device types.

In a second example, the gate-to-source/drain capacitance can be tuned by altering the position of the lower corner of the gate structure relative to the source and drain regions. As the recess depth 41 increases, the gate will overlap more or less of the doped source and drain regions, depending on where the lower boundary of the gate area 53 intersects the doped regions 39 along the sloped profiles 33. A deeper recess depth 41 will then incur less overlap capacitance.

In a third example, a low power transistor that operates at a low threshold voltage may use a thinner gate dielectric or a different gate dielectric material. Such a device may be fabricated by targeting a shallower recess depth 41, than would be used for higher power devices.

Figure 5B:
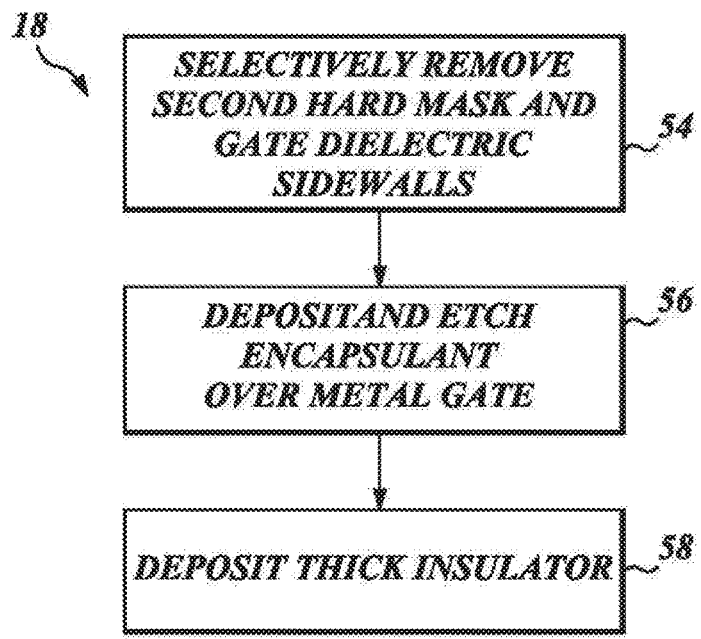
FIGS. 5B-5E are cross-sectional views of the NFET and PFET devices after carrying out processing steps shown in FIG. 5A.
Figure 5B:
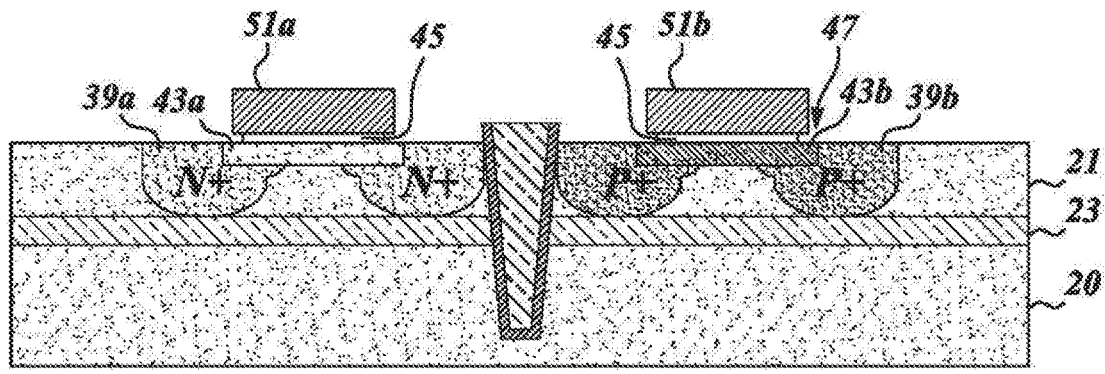
Figure 5C:
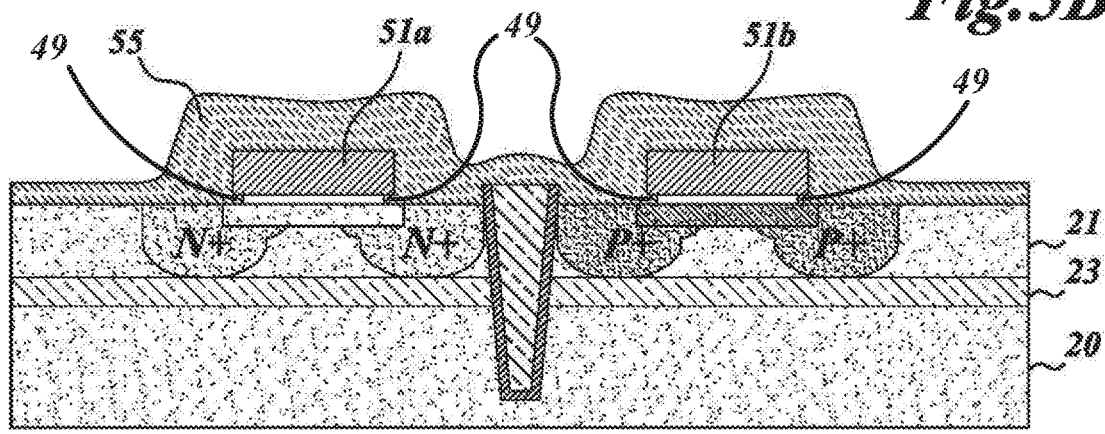
Figure 5D:
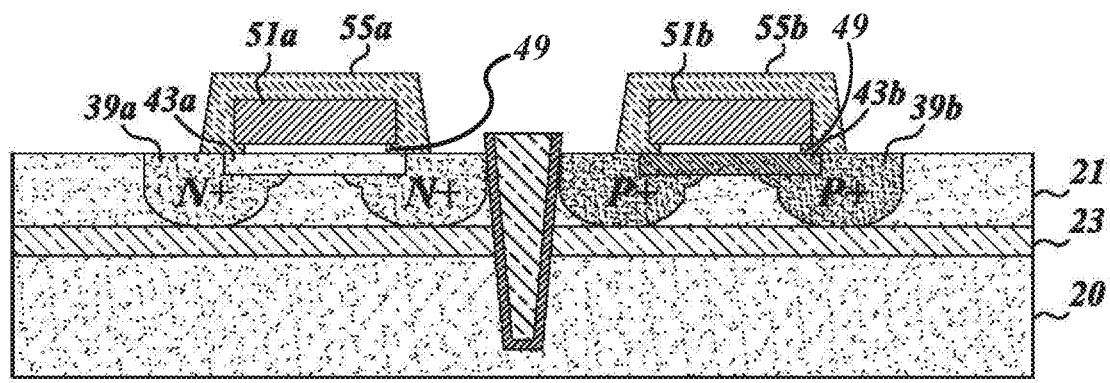
Figure 5E:
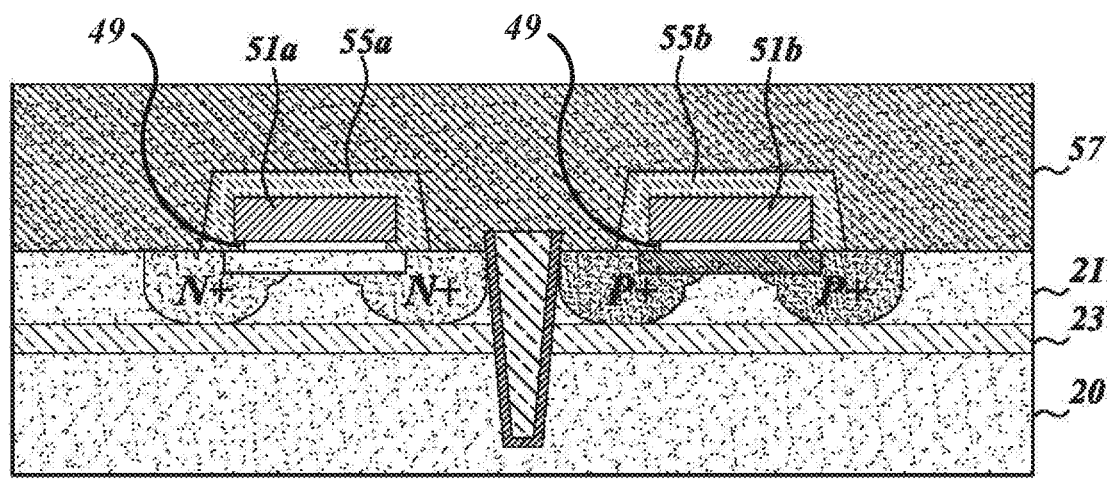
Figure 6A:
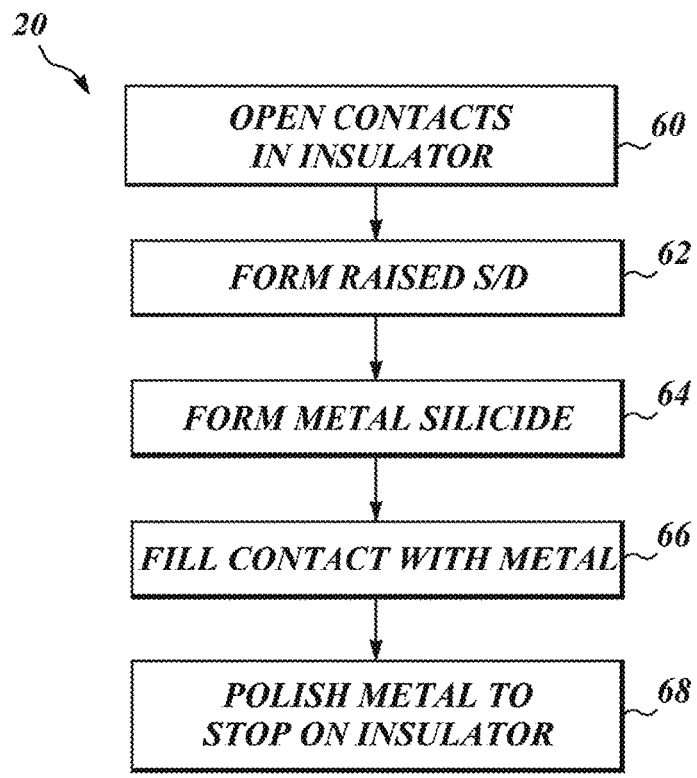
FIG. 6A is a process flow diagram showing a detailed sequence of processing steps that can be used to form contacts to the NFET and PFET devices, according to one embodiment.
Figure 6B:
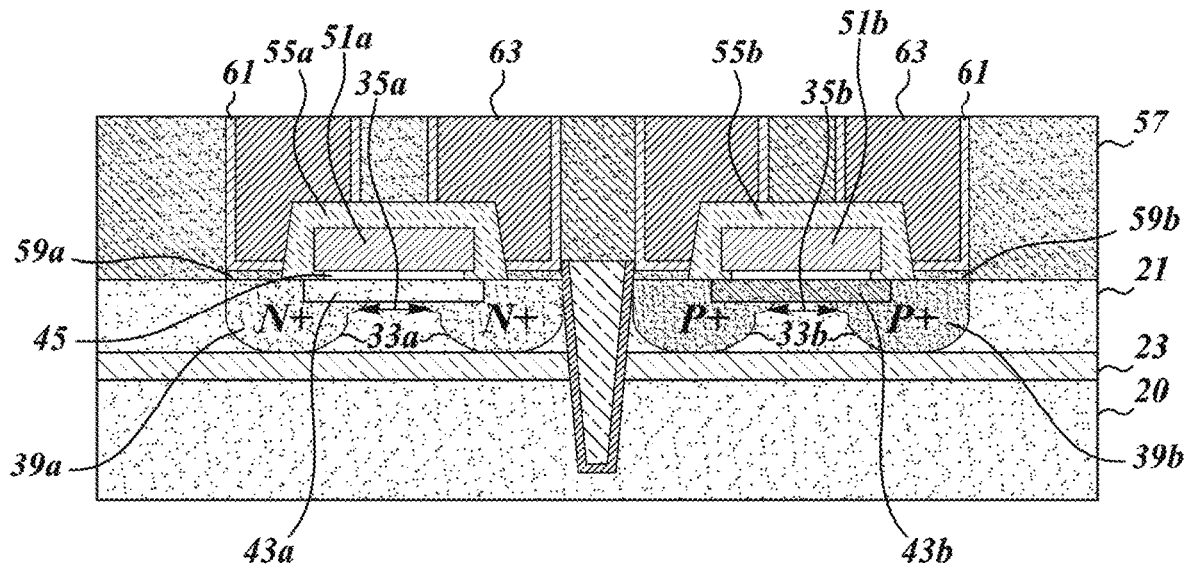
FIGS. 6B-6D are cross-sectional views of finished NFET and PFET devices having gates with different recess depths, after carrying out processing steps shown in FIG. 6A.

It is noted that FIGS. 4A-6B are based on the recess depth 41 as shown in FIG. 3D, which recess depth is deep enough to result in a recessed channel 43, but not so deep as to cause the gate dielectric layer 45 to be recessed below the surface of the active region 21. FIG. 6B shows the completed partial recessed gate transistor that corresponds to the recess depth shown in FIG. 3D. FIGS. 6C and 6D below show other examples of completed partial recessed gate transistors that correspond to recess depths that are deep enough to cause the gate dielectric and a portion of the metal gate to be recessed below the surface of the active region 21.

Figure 4A:
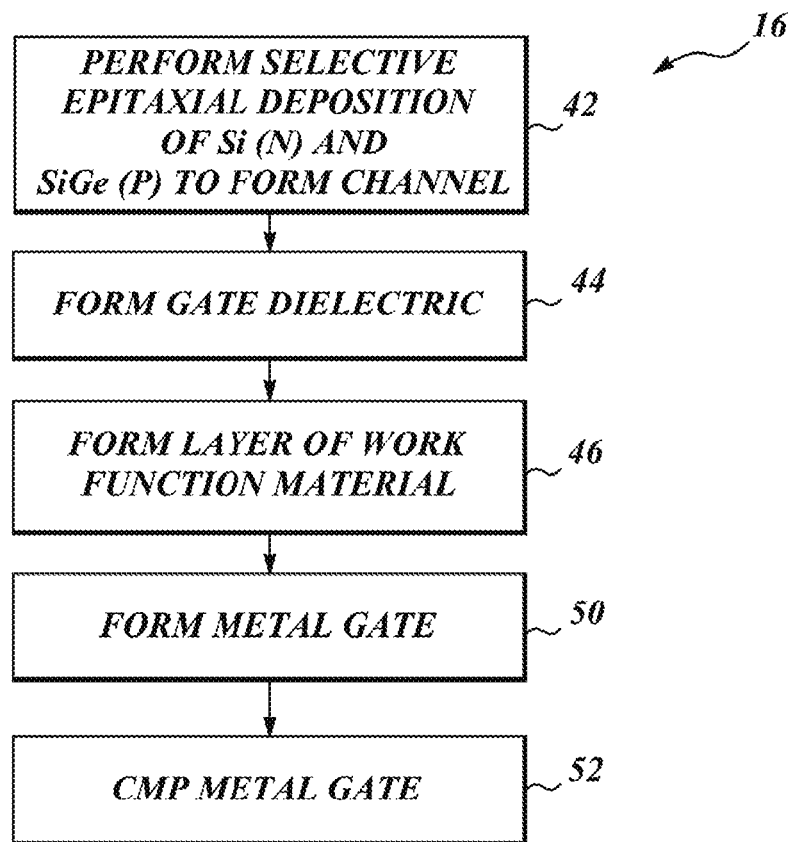
FIG. 4A is a process flow diagram showing a detailed sequence of processing steps that can be used to form partially recessed gates of the NFET and PFET devices, according to one embodiment.
Figure 4B:
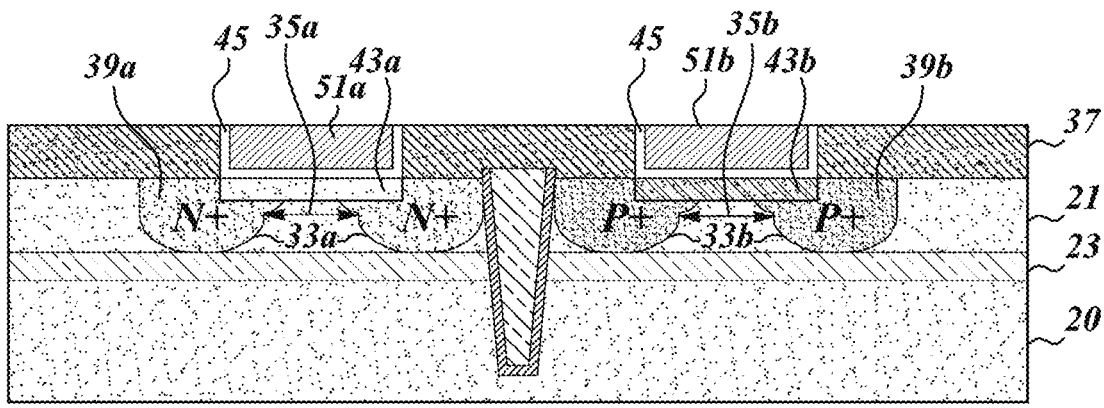
FIG. 4B is a cross-sectional view of the NFET and PFET devices after carrying out processing steps shown in FIG. 4A.

FIG. 4A describes the process step 16 in further detail, as a sequence of steps 42-52 that can be used to fill the partially recessed gate areas 53 as shown FIG. 4B, according to one embodiment.

At 42, selective epitaxial growth of silicon and silicon germanium (SiGe) is performed to form planar epitaxial channel regions 43a and 43b of the N-type and P-type devices, respectively. Epitaxial growth is a deposition technique well known to those skilled in the art, in which atoms are added to the crystalline structure of the current substrate to form a continuous crystal lattice. The epitaxial channel regions 43 are formed below the region where the transistor gates will be formed, along the lower boundaries of the partially recessed gate areas 53. The epitaxial channel regions 43 are desirably about 5-50 nm thick. The epitaxial channel regions 43 feature improved carrier mobility that compensates for the absence of a short channel to provide a comparable switching speed without incurring undesirable short channel effects. By the nature of the epitaxial deposition process, the shape of the depletion region within the epitaxial channel is substantially regular and flat, unlike other transistor channels having depletion regions that can be tapered, asymmetric, or otherwise irregular.

At 44, a gate dielectric 45 is formed on top of the epitaxial channel regions 43, covering the sidewalls of the partially recessed gate areas 53. Since a metal gate will be used in some embodiments, the gate dielectric 45 will be a high-k dielectric in this embodiment. In other cases, the gate dielectric might be a standard dielectric such as $SiO_2$. While the high-k dielectric is useful for metal gates, it has the disadvantage of increasing the gate turn on capacitance. As explained later herein, this effect is reduced in some embodiments. A high-k gate dielectric 45 can be conformally grown as an oxide, for example, hafnium oxide ($HfO_2$), aluminum oxide ($Al_2O_3$), or tantalum pentoxide ($Ta_2O_5$). The dielectric constant of the high-k gate dielectric 45 is desirably greater than about 4.0 and is typically in the range of about 15-25. The thickness of the high-k gate dielectric 45 is desirably within the range of about 2-20 nm.

At 46, the NFET is masked, and a work function material is grown on the PFET device. The work function material can be made of, for example, titanium nitride (TiN), titanium carbon (TiC), or titanium tungsten (TiW). In other embodiments, a work function material is also grown on the NFET device.

At 50, metal gates 51a and 51b are formed. First, a barrier seed layer is grown in the partially recessed gate areas 53 to accommodate subsequent formation of a metal gate. The barrier seed layer forms a barrier to diffusion of the metal atoms into the gate dielectric, to prevent contamination of the gate dielectric. The barrier seed layer material depends on the gate material. For example, if the bulk metal used to form the gate is aluminum, the barrier seed layer material can be titanium (Ti), titanium nitride (TiN), or titanium carbide (TiC); if the gate material is tungsten (W), the barrier seed material can be titanium tungsten (TiW); and if the gate material is copper (Cu), the barrier seed material can be tantalum (Ta) or tantalum nitride (TaN). The thickness of the barrier seed layer is in the range of about 1-10 nm thick, but desirably less than about 8 nm thick. In some embodiments, the barrier seed layer can be a multi-layer stack that includes, for example, 1 nm TiN on 5 nm TiC, on 1 nm TiN.

Next, a bulk metal material is deposited to complete formation of the transistor gate stack. As mentioned above, suitable materials for the bulk metal gate include aluminum, copper, or tungsten, silver, gold, and the like, as well as their alloys and combinations thereof.

At 52, the metal gates 51 are polished using a conventional CMP process that stops on the second hard mask 37 to form a planar top surface.

FIG. 5A describes the process step 18 in further detail, as a sequence of steps 54-58 that can be used to encapsulate the multi-layer gate structure as shown in FIGS. 5B, 5C, and 5D, according to a one embodiment.

At 54, the second hard mask 37 is selectively removed by performing, for example, a plasma etch step. Next, the high-k gate dielectric 45 on the sidewalls of the gate will be removed. At this stage, at least two additional options are possible. In a first embodiment, the removal of the gate dielectric 45 is carried out in a carefully timed etch to remove only the sidewall portions of the gate dielectric 45 and not undercut any portion of the gate dielectric 45 that is below the gate 51. In this embodiment, the gate dielectric 45 has the same footprint as the respective gate 51a, or 51b and the sides of the gate are substantially parallel with the sides of the gate dielectric.

In another alternative embodiment, during the selective removal of the gate dielectric 45 at step 54, the etching operation is carried out sufficient to somewhat undercut the gate 51 to leave an undercut region 47 for the gate metal itself. The amount of the undercut can be selected according to a desired distance to achieve selected transistor properties as explained herein. In this embodiment, the etch results in the gate profiles shown in FIG. 5B in which the sidewalls of the gate stack is exposed. In the case of the NFET device, the barrier seed layer is exposed on the sidewalls, while the work function material is exposed on the sidewalls of the PFET device.

At 56, an encapsulant 55 made of, for example, silicon nitride (SiN), is blanket deposited over the metal gate structures and the source and drain regions 39. The encapsulant 55 is formed in place of a conventional spacer. The encapsulant will also fill the undercut areas below the gates 51, creating a silicon nitride foot 49 between the corners of the metal gate and the doped source and drain regions. Such a foot effectively recesses the encapsulant so that the encapsulant assists in insulating the gate from the source and drain. The depth and shape of the silicon nitride foot varies with the amount of recess created. This is particularly desirable near the corners of the metal gate where charge will tend to accumulate during operation of the transistor. Thus, a recessed foot 49 of the encapsulant material can guard against breakdown of the gate dielectric at the corners of the metal gate.

Process conditions during formation of the encapsulant 55 can be adjusted so as to form a thicker layer over the metal areas than on the silicon surface. A subsequent blanket etch then removes the encapsulant 55 from the source and drain regions while leaving behind the portion of the encapsulant 55 covering the gate structures, as shown in FIG. 5D, in which resulting shape of the encapsulant regions 55a and 55b are substantially trapezoidal. The encapsulant etch process may be a two-step operation that entails a reactive ion etch (RIE) followed by a wet etch and/or a wet cleaning step to remove residual SiN from the silicon surface. The completed encapsulant regions 55a and 55b perform the function that silicon nitride spacers would perform in a conventional device, without necessitating another mask layer.

Another advantage of the encapsulant 55 is that the sidewall removal and subsequent encapsulation of the gate structure has effectively substituted SiN, which has a relatively low dielectric constant, $\kappa_1$ of approximately 7.5, for the high-k sidewall material, which has a dielectric constant $\kappa_0$ of approximately 25 at peripheral regions of the gate while leaving the high-k dielectric material in a central region. Thus, in the region between the lower corners of the gate 51 and the source and drain regions 39, the gate-to-source/drain capacitance, $C=\kappa\epsilon A/d$, is lowered by a factor proportional to $\kappa_1/\kappa_0$ i.e., by a factor of more than three, compared with the gate-to-source/drain capacitance of, for example, a FET having a fully recessed gate as described in U.S. Patent Publication No. 2012/0313144. Removal of the high-k gate dielectric 45 from the sidewalls of the gate 51, and the use of the encapsulant 55 are thus significant advantages in those embodiments of the fabrication method as described herein.

At 58, a thick insulator 57, for example an oxide having a thickness of about 100 nm, can be formed on top of the FET as shown in FIG. 5E. The insulator 57 is then polished using CMP. In some embodiments, the SiN encapsulant 55 serves as a polish stop layer while in others layer 57 is planarized but remains covering all layers as shown in FIG. 5E.

FIG. 6A describes the process step 20 in further detail, as a sequence of steps 60, 62, 64, 66, 68 that can be used to form contacts to the partially recessed gate transistor as shown FIG. 6B, according to a one embodiment.

At 60, contact holes are opened in the insulator 57.

At 62, the source and drain regions are raised by growing doped epitaxial layers 59a and 59b from the N+ and P+ source/drain regions, respectively. The raised source and drain doped epitaxial layers 59a and 59b are doped in situ, during the epitaxy operation. A first epitaxial growth process is carried out that incorporates positive dopants such as boron into an epitaxially grown silicon germanium (SiGe) film. The first epitaxial doping process results in the P-doped epitaxial layer 59b. The concentration of positive dopants in the P-doped epitaxial layer 59b is about 2.0 E21 atoms/cm$^3$. A second epitaxial growth process is carried out that incorporates negative dopants such as phosphorous or arsenic into an epitaxially grown silicon film. The second epitaxial doping process results in the N-doped epitaxial layer 59a. The concentration of negative dopants in the N-doped epitaxial layer 59a is also about 2.0 E21 atoms/cm$^3$.

At 64, a metal silicide layer 61 is formed by conformally depositing a thin metal layer to line the contact holes, for example, using a plasma vapor deposition (PVD) process. The deposited thin metal layer comes into contact with doped silicon in the raised source and drain regions, and reacts chemically with the doped silicon to form a metal silicide compound. The metal silicide layer 61 is also formed on the sides of the contact hole by a chemical reaction between the thin metal layer and a silicon component of the silicon dioxide interlayer dielectric 57. Materials used for the metal silicide layer 61 can include titanium, titanium nitride, platinum, and nickel. The metal silicide layer 61 reduces contact resistance at the raised source/drain boundary, and thus the electrical properties of the metal silicide layer 61 directly influence device performance. Properties of the metal silicide 61 determine, in large part, a contact resistance that characterizes the junction with the raised source/drain 59. Properties of the metal silicide 61 are influenced by the type of metal deposited, the type of dopants used in the raised source/drain, the doping concentration, and the overall film quality. Thickness of the metal silicide 61 is desirably in the range of about 1-20 nm, with a film thickness target of 10-20 nm.

At 66, contact holes are filled with a bulk metal to form contacts 63 to the source and drain terminals of the FET. Similar contacts can be made to the gate terminal in a different vertical plane than that shown in the cross-sectional views herein. Suitable materials for the metal contacts 63 include aluminum, copper, tungsten, silver, gold, and the like, as well as their alloys and combinations thereof.

At 68, the metal contacts are polished using a conventional metal CMP process that stops on the insulator 57.

In one embodiment of the final structure of the partially-recessed gate transistor shown in FIG. 6B, the epitaxial channel 43 is recessed below the surface of the active region 21 of the silicon, while the high-k gate dielectric 45 remains above the top surface of the active region 21 of the silicon. Namely, the top of the channel regions 43a and 43b are flush with the top of substrate layer 21.

Figure 6C:
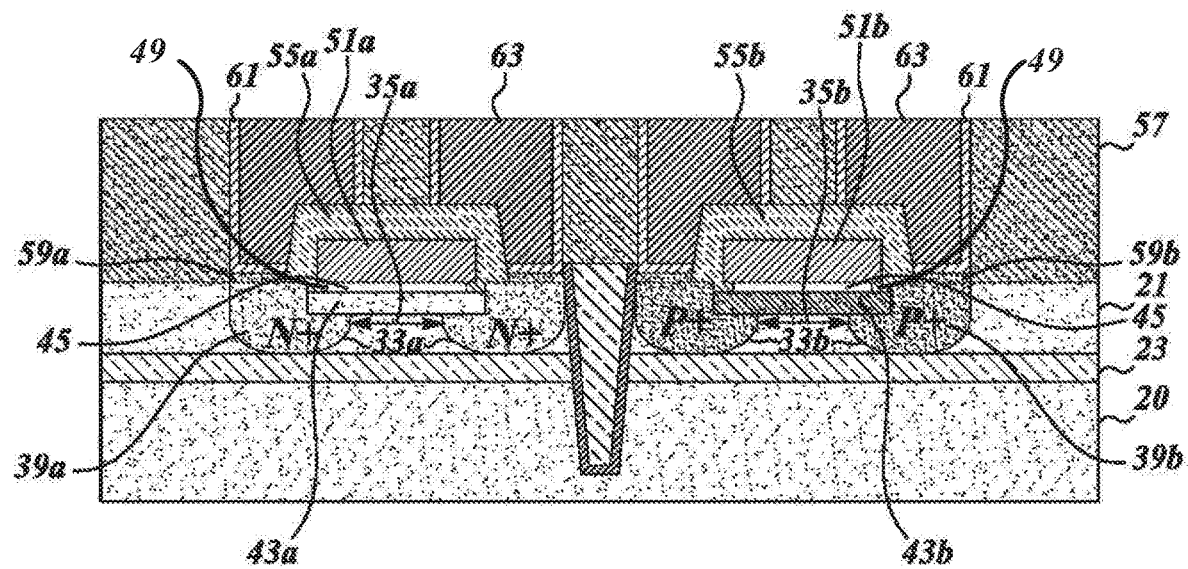
Figure 6D:
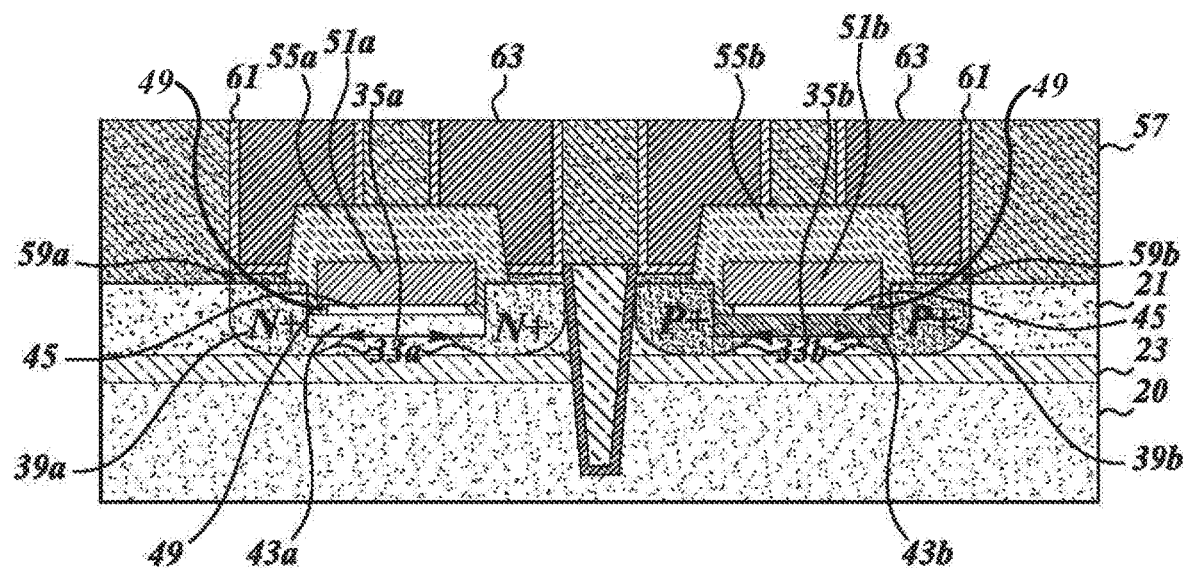

By making adjustments to the recess depth 41, the amount of the gate structure that is recessed can be shifted so as to cause more or less of the high-k gate dielectric 45, the work function material, the barrier seed layer, and the metal gate 51 to be recessed, as long as the recess depth is not so great that the metal gate 51 is completely recessed below the surface of the active region 21 of the silicon. Two such examples of completed partially recessed gate transistors are shown in FIGS. 6C and 6D, in which recess depths 41 of opening 53 are greater than the recess depth used to produce the transistor shown in FIG. 6B. In FIG. 6C, for example, the recess depth 41 was chosen so as to cause the channel and the gate dielectric to be recessed below the surface of the active region 21. In FIG. 6D, for example, the recess depth 41 was chosen so as to cause the channel, the gate dielectric, and approximately half of the gate thickness to be recessed below the surface of the active region 21. It is noted that in FIGS. 6C and 6D, the profile of the silicon nitride foot 49 includes a step that results from the additional recess depth. For deeper recesses, if the encapsulant should fail to fill the step entirely, a partial void between the gate 51 and the source and drain regions 39 will still serve to lower the gate-to-source/drain capacitance. Thus, in some embodiments, the layer 55 might not fill the undercut below the gate 51 and instead form a void or an air gap. This is acceptable because such a void or air gap is an acceptable gate dielectric to have in the peripheral regions in some embodiments.

As previously explained, the doping profiles at the source/drain regions 39a and 39b are selected in advance knowing the depth to which the partially recessed gate will be formed. For example, if it is known that the partially recessed gate will be substantially recessed so that the central portion of the gate is approximately aligned with the top of substrate later 21, then the doping profiles 33 of the source drain regions will be selected during the implantation to achieve a desired graded junction, for example, of the LDD type, with the proper halo implant locations. Based on this, the final location of the channel and gate is determined. Thus, the properties of the source drain regions relative to the channel and the gate can be custom selected based on the desired depth to which the partially recessed gate will be formed. In the embodiment shown, various different profiles are shown for different depths of the partially recessed gate formation and it will be appreciated that any one of these doping profiles can be used at any of the gate depths whether to have a gradual LDD implant of the type shown in FIG. 6B, a more abrupt edge of the type shown in FIG. 6C, or a curved region as shown in FIG. 6D. Any one of these doping profiles could be used at any one of the depths by appropriate implants carried out during step 28 as explained herein, and as shown in FIG. 2C.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

It will be appreciated that, although specific embodiments of the present disclosure are described herein for purposes of illustration, various modifications may be made without departing from the spirit and scope of the present disclosure. Accordingly, the present disclosure is not limited except as by the appended claims.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A transistor, comprising:
a substrate;
a semiconductor body over the substrate;
a doped drain region positioned in the semiconductor body;
a doped source region positioned in the semiconductor body and separated from the doped drain region;
a channel region extending between the source and drain regions, the channel region having a different doping property from those of the doped drain region and the doped source region and at least partially over the doped drain region and the doped source region respectively, with respect to the substrate;
a gate stack partially recessed in the semiconductor body to a recess depth below a top surface of the semiconductor body, the gate stack including:
a gate dielectric in contact with the channel region, the gate dielectric having a dielectric length in a first direction; and
a conductive gate having a gate length in the first direction that exceeds the dielectric length by a distance that defines an undercut region, the conductive gate having a top surface, sidewalls, and an underside; and
a single, continuous encapsulant in contact with the top surface, sidewalls, and underside of the conductive gate, the single, continuous encapsulant including an extension portion positioned below the top surface of the semiconductor body, extending in the undercut region, and in contact with the underside of the conductive gate and an edge surface of the gate dielectric and in contact with both the channel region and the doped source region from a vertical direction with respect to the substrate.

2. The transistor of claim 1, further comprising:
raised source and drain region positioned above the top surface of the semiconductor body and contacting the doped source and drain regions, respectively; and
first and second metal contacts connected to the raised source and drain regions, respectively.

3. The transistor of claim 2, wherein the raised doped source and drain regions are made of epitaxial SiC.

4. The transistor of claim 2, wherein the first metal contact contacts a first lateral side and a top side of the encapsulant and the second metal contact contacts a second lateral side and the top side of the encapsulant.

5. The transistor of claim 1, wherein the channel region is an epitaxial channel made of silicon germanium.

6. The transistor of claim 1, wherein the semiconductor body includes:
a semiconductor substrate;
a semiconductor layer; and
a buried insulating layer positioned between the semiconductor layer and the semiconductor substrate, wherein the doped source and drain regions are positioned in the semiconductor layer and extend to the buried insulating layer.

7. The method of claim 1, wherein the gate dielectric is made of a material having a dielectric constant greater than about 4.0.

8. The transistor of claim 1, wherein the conductive gate includes a metal barrier layer made of a metal silicide that includes one or more of titanium, titanium nitride, titanium carbide, titanium tungsten, tantalum, or tantalum nitride.

9. The transistor of claim 1, wherein the conductive gate includes one or more of aluminum, tungsten, silver, platinum, gold, or copper.

10. A transistor, comprising:
a substrate that includes a buried insulating layer and a semiconductor layer on the buried insulating layer;
a drain region that extends downward to the buried insulating layer;
a source region that extends downward to the buried insulating layer and separated from the drain region;
a channel extending between the source and drain regions, the channel region having a different doping property from those of the doped drain region and the doped source region and at least partially over the doped drain region and the doped source region respectively, with respect to the substrate;
a gate stack partially recessed to a recess depth below the top surface of the substrate, the gate stack including:
a gate dielectric in contact with the channel, the gate dielectric having a dielectric length in a first direction; and
a conductive gate having a gate length in the first direction that exceeds the dielectric length by a distance that defines an undercut region, the conductive gate having a top surface, sidewalls, and an underside; and
a single, continuous encapsulant in contact with the top surface, sidewalls, and underside of the conductive gate, the single, continuous encapsulant including an extension portion positioned below the top surface of the semiconductor body, extending in the undercut region, and in contact with the underside of the conductive gate and an edge surface of the gate dielectric and in contact with both the channel region and the doped source region from a vertical direction with respect to the substrate.

11. The transistor of claim 10, wherein the source region and drain region extend above a top surface of the substrate.

12. The transistor of claim 10, further comprising first and second metal contacts connected to the doped source and drain regions, respectively, wherein the first metal contact contacts a first lateral side and a top side of the encapsulant and the second metal contact contacts a second lateral side and the top side of the encapsulant.

13. The transistor of claim 10, wherein the channel is an epitaxial channel made of silicon germanium.

14. The transistor of claim 10, wherein the gate dielectric is made of a material having a dielectric constant greater than about 4.0.

15. A transistor, comprising:
a substrate that includes a buried insulating layer and a silicon layer on the buried insulating layer;
a drain region that extends downward to the buried insulating layer;
a source region that extends downward to the buried insulating layer, and separated from the drain region;
an epitaxial channel extending between the source and drain regions, the epitaxial channel being made of silicon germanium, the channel region having a different doping property from those of the doped drain region and the doped source region and at least partially over the doped drain region and the doped source region, respectively, with respect to the substrate;
a gate stack including:
a gate dielectric in contact with the epitaxial channel, the gate dielectric having a dielectric length in a first direction; and
a conductive gate having a gate length in the first direction that exceeds the dielectric length by a distance that defines an undercut region, the conductive gate having a top surface, sidewalls, and an underside; and
a single, continuous encapsulant in contact with the top surface, sidewalls, and underside of the conductive gate, the encapsulant including an extension portion positioned below the top surface of the semiconductor body, extending in the undercut region, and in contact with the underside of the conductive gate and an edge surface of the gate dielectric and in contact with both the channel region and the doped source region from a vertical direction with respect to the substrate.

16. The transistor of claim 15, further comprising:
raised source and drain regions positioned above the top surface of the semiconductor body and contacting the doped source and drain regions, respectively.

17. The transistor of claim 16, further comprising:
first and second metal contacts connected to the raised source and drain regions, respectively.

18. The transistor of claim 17, wherein the first metal contact contacts a first lateral side and a top side of the encapsulant and the second metal contact contacts a second lateral side and the top side of the encapsulant.

19. The transistor of claim 16, wherein the raised doped source and drain regions are made of epitaxial SiC.

20. The transistor of claim 15, wherein the gate stack is partially recessed in the semiconductor body to a recess depth below a top surface of the semiconductor body.

* * * * *